United States Patent [19]

Monticelli

[11] Patent Number: 4,758,873

[45] Date of Patent: Jul. 19, 1988

[54] BALANCED MOS CAPACITOR WITH LOW STRAY CAPACITANCE AND HIGH ESD SURVIVAL

[75] Inventor: Dennis M. Monticelli, Fremont, Calif.

[73] Assignee: National Semiconductor Corporation, Santa Clara, Calif.

[21] Appl. No.: 863,918

[22] Filed: May 16, 1986

[51] Int. Cl.$^4$ .............................................. H01L 27/02
[52] U.S. Cl. ........................................ 357/51; 357/14; 357/23.6
[58] Field of Search .......................... 357/14, 23.6, 51

[56] References Cited

U.S. PATENT DOCUMENTS

| | | | |
|---|---|---|---|
| 4,377,029 | 3/1983 | Ozawa | 357/14 |
| 4,453,090 | 6/1984 | Sempel | 357/23.6 |
| 4,626,881 | 12/1986 | Kishi et al. | 357/23.6 |

Primary Examiner—Andrew J. James
Assistant Examiner—Gregory Key
Attorney, Agent, or Firm—Gail W. Woodward; Lee Patch

[57] ABSTRACT

A peaking capacitor for use with a differential input stage in an integrated circuit. The stage includes emitter degeneration resistors and a peaking capacitor coupled between the emitters. The capacitor is formed of MOS capacitors located over thinned oxide portions that lie within the confines of doped regions forming PN junctions with the semiconductor substrate. The doped regions are spaced apart by a distance that will result in depletion region reach-through at a voltage that is lower than the thinned oxide breakdown voltage. Thus, the structure is self-protecting and therefore resistant to electrostatic discharge damage. The capacitor that is formed has a value that is determined accurately by the area of the thinned oxide. It also has a low stray capacitance which makes it useful as a peaking capacitor.

5 Claims, 2 Drawing Sheets

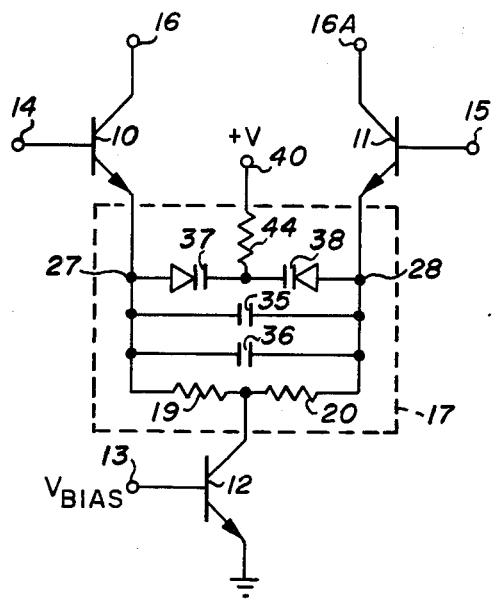
Fig_1
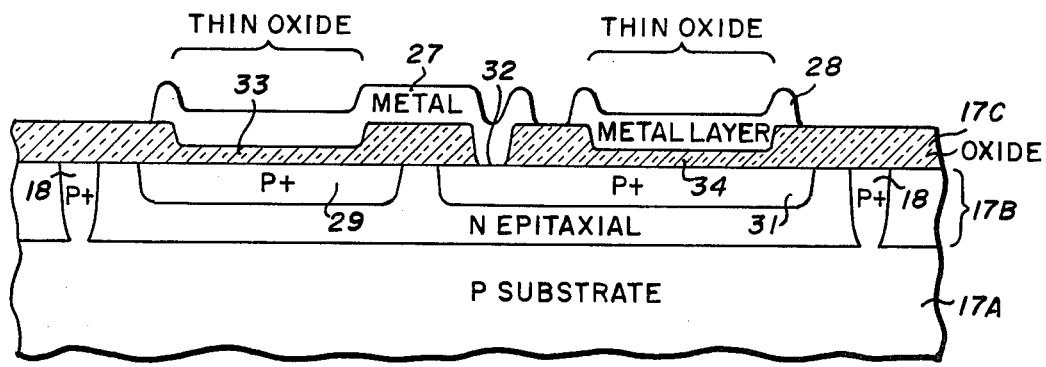
Fig_3

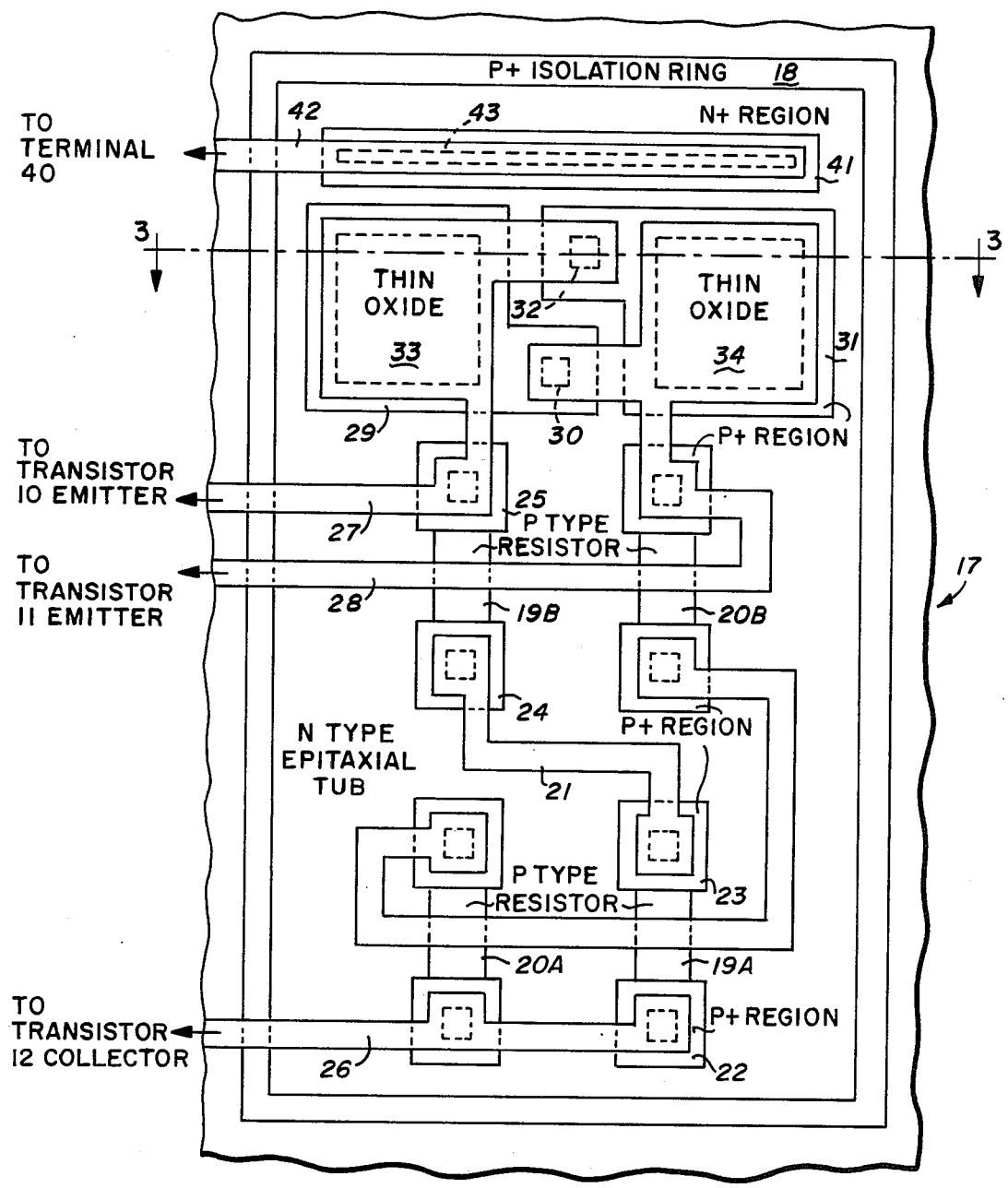
Fig_2

BALANCED MOS CAPACITOR WITH LOW STRAY CAPACITANCE AND HIGH ESD SURVIVAL

BACKGROUND OF THE INVENTION

The invention relates to a metal-oxide-semiconductor (MOS) capacitor suitable for operation in monolithic PN-junction isolated integrated circuit (IC) structures. The capacitor is balanced so that it can be used in the conventional differential amplifier circuits and it has low stray capacitance. As a further feature the capacitor can be used in differential input stages which are subject to electrostatic discharge (ESD) that can damage the input trasistors or any components connected thereto. It has been found that semiconductor devices are susceptible to damage from static discharges when unpowered. This can occur in testing or merely in the handling of the devices. For example, the average human body displays a typical capacitance to ground of about 120 picofarads and can easily carry a charge of 1.5 kV. The semiconductor industry has therefore developed an ESD simulation test of discharging a capacitor charged to a high voltage through pairs of IC terminals of devices that are otherwise unconnected. The devices should survive such a test without damage to show that it should survive normal handling. To quantify such testing the test capacitor is charged to an ever increasing voltage and then discharged through a resistor into the IC. The devices can then be rated for survival at specified ESD voltages.

In conventional IC structures the input transistors are the most likely to be damaged by ESD. In particular, the most common failure made is destruction of the emitter-base diode. It has been found that adding series resistors to the emitters of a differentially operated transistor input pair provides improved large signal performance such as slew rate and distortion. It has further been found that when such resistors are employed a peaking capacitor connected between the emitters will improve small signal performance. This circuit structure is exemplified in the well-known LM143/LM343 and LM144/LM344 operational amplifier families. Such peaking capacitors typically have a value of a few picofarads and should be balanced with respect to stray capacitance and to other parts of the IC. In addition to being balanced, the stray capacitance should also be as small as possible. The various requirements indicate that such a capacitor should preferrably be of the MOS variety and it should have as large a breakdown voltage as possible. While the inclusion of peaking capacitor input circuits will provide superior IC performance it tends to make the IC more prone to ESD damage. It would therefore be desirable to improve the resistance of peaking capacitors to ESD damage.

SUMMARY OF THE INVENTION

It is an object of the invention to provide an IC capacitor structure that is balanced, has low stray capacitance and resists ESD damage.

It is a further object of the invention to provide a balanced MOS capacitor in an IC structure for peaking capacitor operation.

These and other objects are achieved by forming MOS capacitors on a P semiconductor region having a thin surface oxide. The overlying metallization forms a capacitor with the P region. A pair of such capacitors are symmetrically formed and cross-connected so that they are coupled in parallel and balanced. These MOS capacitors are formed in an isolated tub of epitaxial material in the IC and the isolated tub is returned to a positive potential. Thus, each of the MOS capacitors will include a stray PN junction capacitor that connects from the emitter of one transistor of the differential pair to the source of positive potential for the tub. To the extent that path from the tub contact to the junction capacitors contains series resistance, the two stray junction capacitors will tend to couple in series across the MOS capacitors. The resulting structure provides a substantial capacitance that has a low stray capacitance so that it can be employed as a peaking capacitor. The two P regions are located close together so that they produce a lateral transistor in which the intervening material acts as a base. By employing suitably close spacing this lateral transistor can be made to punch through at a suitably low voltage and thereby prevent the capacitor voltage from rising to a destructive level.

BRIEF DESCRIPTION OF THE DRAWING

FIG. 1 is a schematic diagram illustrating how the capacitor is connected in a peaking circuit.

FIG. 2 is a plan view of a semiconductor chip fragment into which a peaking capacitor and the transistor emitter resistors for a differential pair are contained.

FIG. 3 is a cross-section of the chip fragment of FIG. 2 taken at the line 3—3.

The drawing is not to scale, but is intended to show the structural details. For example, in FIG. 3, the vertical scale is exaggerated so that the fine detail of the structure can be discerned.

DESCRIPTION OF THE INVENTION

In the schematic diagram of FIG. 1 a pair of transistors 10 and 11 are to be operated as a differential input stage in an operational amplifier (not shown). Constant current transistor 12 is biased at terminal 13 to conduct the differential pair tail current. Terminals 14 and 15 constitute the input terminals for the differential pair and terminals 16 and 16A constitute the output terminals. The elements inside dashed outline 17, which include the capacitor of the invention, are illustrated in FIG. 2.

In the preferred embodiment of the invention the IC is fabricated using conventional well-known planar processing in a monolithic PN junction isolated structure. FIG. 3 is a cross section of the FIG. 2 structure showing the various elements of such a IC. In such construction a P type silicon wafer 17A is provided with an N type epitaxial layer 17B. A P+ isolation ring 18 extends through the epitaxial layer 17B to contact substrate 17A. Thus, the epitaxial layer inside ring 18 forms a PN junction isolated tub that contains the same elements shown in FIG. 2. The planar process includes the formation of a passivating oxide 17C which is transparent and therefore not evident in FIG. 2, but is illustrated in FIG. 3.

The various metallizations, for example 21, 26, 27 28 and 42, have dashed outlines therein. These represent holes in the planar oxide where ohmic contact is made to the underlying silicon. However, regions 33 and 34, which are also shown in dashed outlines, represent thinned oxide portions where the capacitors are to be localized.

Resistors 19 and 20 are coupled in series with the transistor emitters. In FIG. 2 each of these resistors is shown composed of a pair of series-connected elements.

For example, resistor 19 is composed of segments 19A and 19B connected in series by the chip metallization 21. It will be noted that the resistor elements are cross-connected for symmetry. Each resistor segment is composed of a pair P+ contact regions. For example, P+ regions 22 and 23 contact the ends of a P region 19A to form a resistor. Likewise, P+ regions 24 and 25 contact the ends of P region 19B. While the resistor structure shown is the preferred form of construction, other forms, well known in the IC art, can be employed.

Metallization 26 commonly connects the ends of resistors 19A and 20A to the IC and, in the case shown, to the collector of transistor 12. Metallization 27 is the emitter connection of transistor 10 and metallization 28 is the emitter connection of transistor 11.

P+ region 29 underlies metallization 27 and is ohmically connected to metallization 28 at contact 30. Likewise, P+ region 31 underlies metallization 28 and is ohmically connected to metallization 27 at contact 32. The planar oxide 17C is ordinarily about a micron thick. In regions 33 and 34 a thinned portion of oxide is created. Typically, the oxide is completely etched away and the thin portion grown over N+ type material in an oxidizing atmosphere. This typically results in an oxide thickness of about 2000 Å. When this is done over P+ material, as shown, the resulting oxide is only 1000 Å thick. It will have a capacitance of about 0.34 femtofarads per square micron and a breakdown voltage of about 80 volts.

Referring back to FIG. 1 capacitor 35 is the element formed mostly over thin oxide 33 and exists between metallization 27 and P+ region 29. Capacitor 36 is the element formed mostly over thin oxide 34 and exists between metallization 28 and P+ region 31. It can be seen that in each case the thin oxide regions 33 and 34 dominate over the stray capacitance represented by junction capacitors 37 and 38, whose capacitance is only 0.1 pf/mil$^2$.

Capacitor 37 is the PN junction capacitance between P+ region 31 and the N type epitaxial material. Capacitor 38 is the PN junction capacitance between P+ region 29 and the N type epitaxial material. The juncture of capacitors 37 and 38 is connected to +V via resistor 44 that is composed of epitaxial resistance in this case, but may also be a discrete resistor element. This ensures that the PN junctions forming the capacitors are reverse biased. If the resistor 44 is sufficiently large, these two stray junction capacitors will effectively appear in series across the desired capacitors 35 and 36 thus summing with their capacitance. In FIG. 2 N+ region 41 forms an ohmic contact with the N type epitaxial tub inside isolation ring 18. Metallization 42 makes contact with N+ type region 41 by way of an aperture 43 in oxide film 17C.

It can be seen from FIGS. 2 and 3 that P+ regions 29 and 31 are spaced close together and confront each other. This means that a lateral PNP transistor is present in which the P+ regions form the emitter/collector electrodes and the intervening N type material forms the transistor base. N+ region 41 would therefore represent the transistor base contact. By controlling the spacing between P+ regions 29 and 31 the transistor punch-through voltage can be controlled. This is the voltage between emitter and collector at which the resultant depletion region around the collector reaches through the base to touch the emitter. Once this occurs, the transistor collector resistance drops to a very low value and the current rises rapidly with further voltage increase. Thus, the punch-through acts as a voltage limiter across the thin oxide capacitors. The spacing between P+ regions 29 and 31 is set so that punch-through develops below oxide breakdown voltage. This makes the capacitor of the invention self protecting and greatly increases the resistance to ESD degradation. Where a packaged die containing the invention is subjected to ESD while in an unpowered state, the breakdown mechanism is the breakdown between the capacitors is via Beta multiplication of pre-avalanche collector-base current because the base region (the epitaxial layer in this case) is floating. This breakdown voltage is lower than the punch-through voltage and is also protective of the oxide integrity.

EXAMPLE

The capacitor of the invention shown in FIGS. 2 and 3 was constructed as shown in a monolithic PN junction isolated IC using planar processing. The thin oxide was grown to a thickness of about 1000 Å while the planar oxide was about one micron thick. Resistors 19 and 20 were each made up of a pair of 300 ohm resistor elements thereby making their values 600 ohms. The thin oxides were made to have an area of about 1600 square microns each to give a total capacitance of about 1.1 picofarads. The oxide breakdown voltage was in excess of about 80 volts. Diodes 37 and 38 each had an undepleted (unbiased) capacitance of about 0.2 picofarads which is smaller than the thin oxide capacitors. The spacing between adjacent P+ regions was made about 9 microns which resulted in a punchthrough voltage of about 19 volts. When the epitaxial region was allowed to float, the protective breakdown voltage was about 13 volts. Using an ESD test in which a 120 picofarads capacitor was charged to over increasing voltages and then discharged through 1.5 Kz across the op amp input terminals it was found that the emitter-base junctions of the input transistors were destroyed before the peaking capacitors suffered any damage. This occurred at about 900 to 1000 V.

The invention has been described and a working example detailed. When a person skilled in the art reads the foregoing description, alternatives and equivalents, within the spirit and intent of the invention, will be apparent. Accordingly, it is intended that the scope of the invention be limited only by the following claims.

I claim:

1. An integrated circuit capacitor having symmetrical electrical characteristics and low stray capacitance, said capacitor comprising:
    a semiconductor body of one conductive type;
    first and second doped regions of the opposite conductivity type formed in said body to create PN junctions therein that extend to the surface thereof to define the extent of said first and second doped regions;
    an oxide layer covering said semiconductor body and having thinned areas located within the perimeters of said first and second doped regions;
    first and second metallizations respectively overlying said first and second doped regions and arrayed to overlap said thinned areas thereby to form a pair of capacitors between said first and second doped regions and said metallizations;
    means for connecting said first metallization to said second doped region and means for connecting said second metallization to said first doped region whereby said pair of capacitors are parallel connected; and means for connecting said first and second metallizations to said integrated circuit.

2. The capacitor of claim 1 wherein said first and second doped regions have confronting edges and are spaced apart by an amount that will result in depletion region reach-through at a voltage that is below that of the breakdown of the oxide in said thinned areas.

3. The capacitor of claim 1 wherein said semiconductor body has a contact made thereto with metallization connected to a potential that ensures that said PN junctions associated with said first and second doped regions are reverse biased thereby creating a pair of series connected capacitances with said pair of capacitances being connected in parallel with said metallization capacitors.

4. The capacitor of claim 3 wherein said integrated circuit is of the monolithic PN junction isolated type wherein said body is in the form of an epitaxial layer and said first and second doped regions are located inside an isolation ring that extends through said epitaxial layer to define a tub of epitaxial material.

5. The capacitor of claim 4 wherein said integrated circuit includes at least one pair of transistors having their emitters coupled to a common node whereby said pair is connected to operate differentially and includes at least one emitter degeneration resistor coupled in series with the emitter of one of said pair of transistors and wherein said tub of epitaxial material also contains said emitter degeneration resistor.

* * * * *